(12) United States Patent
Lee et al.

(10) Patent No.: US 8,772,838 B2
(45) Date of Patent: Jul. 8, 2014

(54) SEMICONDUCTOR LAYOUT STRUCTURE

(71) Applicant: Inotera Memories, Inc., Taoyuan (TW)

(72) Inventors: Tzung-Han Lee, Taipei (TW);
Chung-Yuan Lee, Taoyuan County (TW)

(73) Assignee: Inotera Memories, Inc., Hwa-Ya Technology Park Kueishan, Taoyuan (TW)

( * ) Notice: Subject to any disclaimer, the term of this patent is extended or adjusted under 35 U.S.C. 154(b) by 0 days.

(21) Appl. No.: 13/831,907

(22) Filed: Mar. 15, 2013

(65) Prior Publication Data

US 2014/0124844 A1   May 8, 2014

(30) Foreign Application Priority Data

Nov. 7, 2012 (TW) .............................. 101141313 A

(51) Int. Cl.
| | | |
|---|---|---|
| H01L 27/10 | (2006.01) | |
| H01L 29/739 | (2006.01) | |
| H01L 29/73 | (2006.01) | |
| H01L 27/07 | (2006.01) | |
| H01L 29/78 | (2006.01) | |
| H01L 45/00 | (2006.01) | |

(52) U.S. Cl.
CPC ............ *H01L 27/0733* (2013.01); *H01L 29/78* (2013.01); *H01L 45/122* (2013.01)
USPC ............ 257/202; 257/206; 257/207; 257/208; 257/E23.151; 257/E23.175; 257/E29.026; 257/E29.027; 257/E29.12; 257/E29.136

(58) Field of Classification Search
CPC ............ H01L 27/0207; H01L 29/0692; H01L 45/122

USPC .................. 257/202, 206, 207, 208, E23.151, 257/E23.175, E29.026, E29.027, E29.12, 257/E29.136

See application file for complete search history.

(56) References Cited

U.S. PATENT DOCUMENTS

| | | | |
|---|---|---|---|
| 5,298,775 A * | 3/1994 | Ohya | 257/211 |
| 5,838,036 A | 11/1998 | Mori | |
| 7,072,210 B2 | 7/2006 | Jeng | |
| 7,259,065 B2 * | 8/2007 | Goo et al. | 438/259 |
| 7,323,746 B2 * | 1/2008 | Park et al. | 257/330 |
| 7,423,300 B2 * | 9/2008 | Lung et al. | 257/207 |
| 7,457,154 B2 | 11/2008 | Yen | |
| 7,529,114 B2 | 5/2009 | Asao | |
| 7,642,572 B2 * | 1/2010 | Popp et al. | 257/211 |
| 7,759,704 B2 * | 7/2010 | Popp et al. | 257/208 |
| 7,767,521 B2 | 8/2010 | Baek | |
| 7,920,400 B2 * | 4/2011 | Lee et al. | 365/63 |
| 8,093,724 B2 * | 1/2012 | Hasunuma | 257/773 |
| 8,129,770 B2 * | 3/2012 | Shiratake | 257/296 |
| 8,184,471 B2 * | 5/2012 | Woo et al. | 365/149 |
| 8,471,320 B2 * | 6/2013 | Lee et al. | 257/296 |
| 2005/0265068 A1 * | 12/2005 | Takemura et al. | 365/149 |
| 2008/0035956 A1 * | 2/2008 | Manning | 257/202 |

* cited by examiner

*Primary Examiner* — Ida M Soward
(74) *Attorney, Agent, or Firm* — Winston Hsu; Scott Margo

(57) ABSTRACT

A semiconductor layout structure includes multiple active blocks which are disposed on a substrate, parallel with one another and extending along a first direction, multiple first shallow trench isolations which are disposed on a substrate, parallel with one another and respectively disposed on the multiple active blocks, and multiple second shallow trench isolations which are disposed on a substrate, cutting through multiple active blocks and extending along a second direction. The first direction has an angle about 1 degree to about 53 degrees to the second direction.

7 Claims, 6 Drawing Sheets

SEMICONDUCTOR LAYOUT STRUCTURE

BACKGROUND OF THE INVENTION

1. Field of the Invention

The present invention generally relates to a semiconductor layout structure. In particular, the present invention is directed to a semiconductor layout structure with two sets of shallow trench isolations which are neither parallel with nor perpendicular to each other, in order to substantially increase the area of the active area.

2. Description of the Prior Art

In the semiconductor layout structure, an active region accommodates the gate, the source and the drain, which is the core region in a semiconductor element. Besides, because the gate, the source and the drain respectively need a contact plug to electrically connect other circuits upwardly penetrating the interlayer dielectric layer, the size of the contact area of the source, the drain and the gate would directly affect the process window of following etching processes to establish the contact plugs aligning with the gate, the source and the drain, as well as affect the contact resistance of the contact plugs. However, there is no semiconductor layout structure to solve such problems in the current field.

So a novel semiconductor layout structure is still needed to increase the area of the active region in working order, to substantially increase the area of the gate, the source and the drain, to facilitate to increase the etching process window, as well as to effectively reduce the contact resistance of the contact plugs.

SUMMARY OF THE INVENTION

The present invention accordingly proposes a novel semiconductor layout structure. By means of two sets of specially arranged shallow trench isolations which are neither parallel with nor perpendicular to each other, it is able to increase the area of the active region in working order, to substantially increase the area of the gate, the source and the drain, to facilitate to increase the etching process window, as well as to effectively reduce the contact resistance of the contact plugs.

The present invention firstly proposes a semiconductor layout structure including a substrate, a plurality of active blocks, a plurality of first shallow trench isolation and a plurality of second shallow trench isolations. The active blocks are disposed on the substrate, parallel with each other and extend along a first direction. The first shallow trench isolations are disposed on the substrate, parallel with each other and respectively disposed between the active blocks. The second shallow trench isolations are disposed on the substrate, cut through the active blocks and extend along a second direction. The first direction and the second direction have an angle between 1 degree to 53 degrees.

In one embodiment of the present invention, the semiconductor layout structure further includes word lines disposed on the substrate, parallel with each other and extending along a third direction. The first direction and the third direction have an angle between 30 degrees to 60 degrees.

In another embodiment of the present invention, the semiconductor layout structure further includes bit line contacts disposed on the substrate, parallel with each other, respectively disposed between the second shallow trench isolations and extending along the second direction. The bit line contacts respectively divide the active blocks into a gate area overlapping the bit line contacts, as well as a source region and a drain region disposed at both sides of the gate region.

In another embodiment of the present invention, the semiconductor layout structure further includes bit lines, disposed on the substrate and simultaneously parallel with each other. The word lines and the bit lines are substantially perpendicular to each other.

In another embodiment of the present invention, the word lines and the bit lines may have an angle from 85 degrees to 95 degrees.

The present invention secondly proposes a semiconductor layout structure including a substrate, a plurality of active blocks, a plurality of first shallow trench isolation, a plurality of second shallow trench isolations, a plurality of word lines, a plurality of bit line contacts, a plurality of bit lines, a plurality of capacitor regions and a plurality of gaps. The active blocks are disposed on the substrate, parallel with each other and extend along a first direction. The first shallow trench isolations are disposed on the substrate, parallel with each other and respectively disposed between the active blocks. The second shallow trench isolations are disposed on the substrate, cut through the active blocks so that the active blocks become a plurality of active areas which are electrically insulated to each other, and extend along a second direction. The first direction and the second direction have an angle between 1 degree to 53 degrees. The word lines are disposed on the substrate, parallel with each other and extend along a third direction. The first direction and the third direction have an angle between 30 degrees to 60 degrees. The bit line contacts are disposed on the substrate, parallel with each other, respectively disposed between the second shallow trench isolations and extend along the second direction. The bit line contacts respectively divide the active areas into a gate area overlapping the bit line contacts, as well as a source region and a drain region disposed at both sides of the gate region. The bit lines are disposed on the substrate and simultaneously parallel with each other. The word lines and the bit lines are substantially perpendicular to each other. A plurality of capacitor regions and a plurality of gaps are alternately disposed in the active blocks. The capacitor regions overlap the second shallow trench isolations and the word lines. The bit line contacts overlap the gaps.

In one embodiment of the present invention, the word lines and the bit lines have an angle from 85 degrees to 95 degrees.

These and other objectives of the present invention will no doubt become obvious to those of ordinary skill in the art after reading the following detailed description of the preferred embodiment that is illustrated in the various figures and drawings.

DETAILED DESCRIPTION

The present invention provides a novel semiconductor layout structure. By arranging two sets of shallow trench isolations which are neither parallel with nor perpendicular to each other, it can increase the area of active regions disposed inbetween in working order, to substantially increase the area of the gate, the source and the drain, to facilitate to increase the etching process window, as well as to effectively reduce the contact resistance of the contact plugs.

Figure 1:
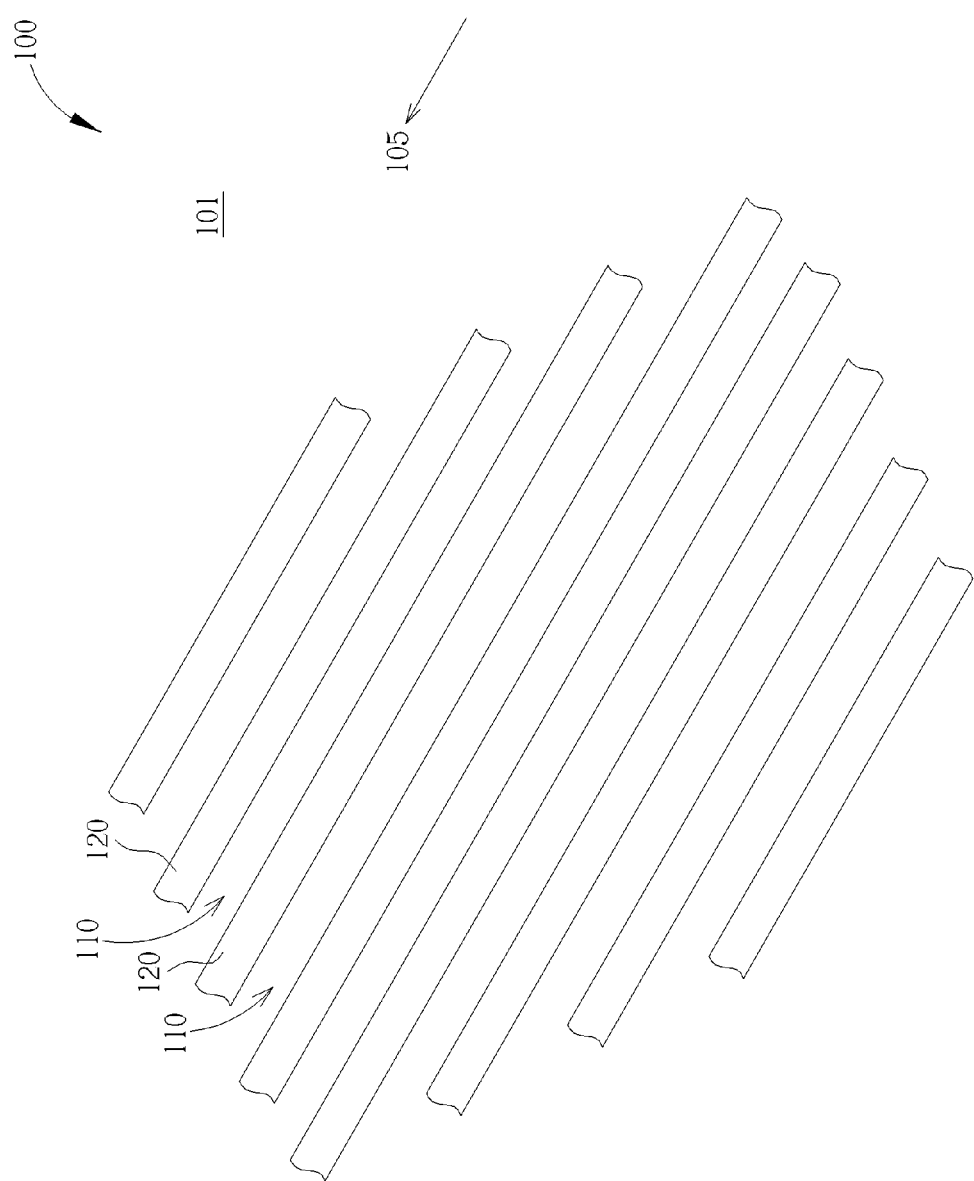
FIG. 1 to FIG. 6 illustrate examples of the semiconductor layout structures of the present invention in which different elements are gradually increased.

FIG. 1 to FIG. 6 illustrate the layout structure of the semiconductor of the present invention by gradually adding different elements. First, as shown in FIG. 1, FIG. 1 illustrates the basic elements in the semiconductor layout structure. In FIG. 1 of the semiconductor layout structure 100, a plurality of first shallow trench isolations 110 and a plurality of active blocks 120 disposed on the substrate 101 extend along a first direction 105. The first shallow trench isolations 110 and active blocks 120 are parallel with one another and arranged in an alternate order. The first shallow trench isolations 110 are separated by a proper pitch, and the active blocks 120 are also separated by another proper pitch. The active blocks 120 are completely surrounded by shallow trench isolations. The active blocks 120 are electrically isolated to other adjacent active blocks 120 due to the segregation of the adjacent first shallow trench isolations 110. Traditional processes may be used to form the first shallow trench isolations 110.

The formation of the first shallow trench isolations 110 may refer to the following steps. First, a hard mask (not shown) is used to etch the substrate 101 to form the trenches (not shown) for the shallow trench isolations. Subsequently, an insulating material (not shown) is used to fill the previously formed trenches (not shown), and a following planarization is used to remove the excess insulating material (not shown) before removing the hard mask (not shown) to obtain the resultant first shallow trench isolations 110.

Figure 2:
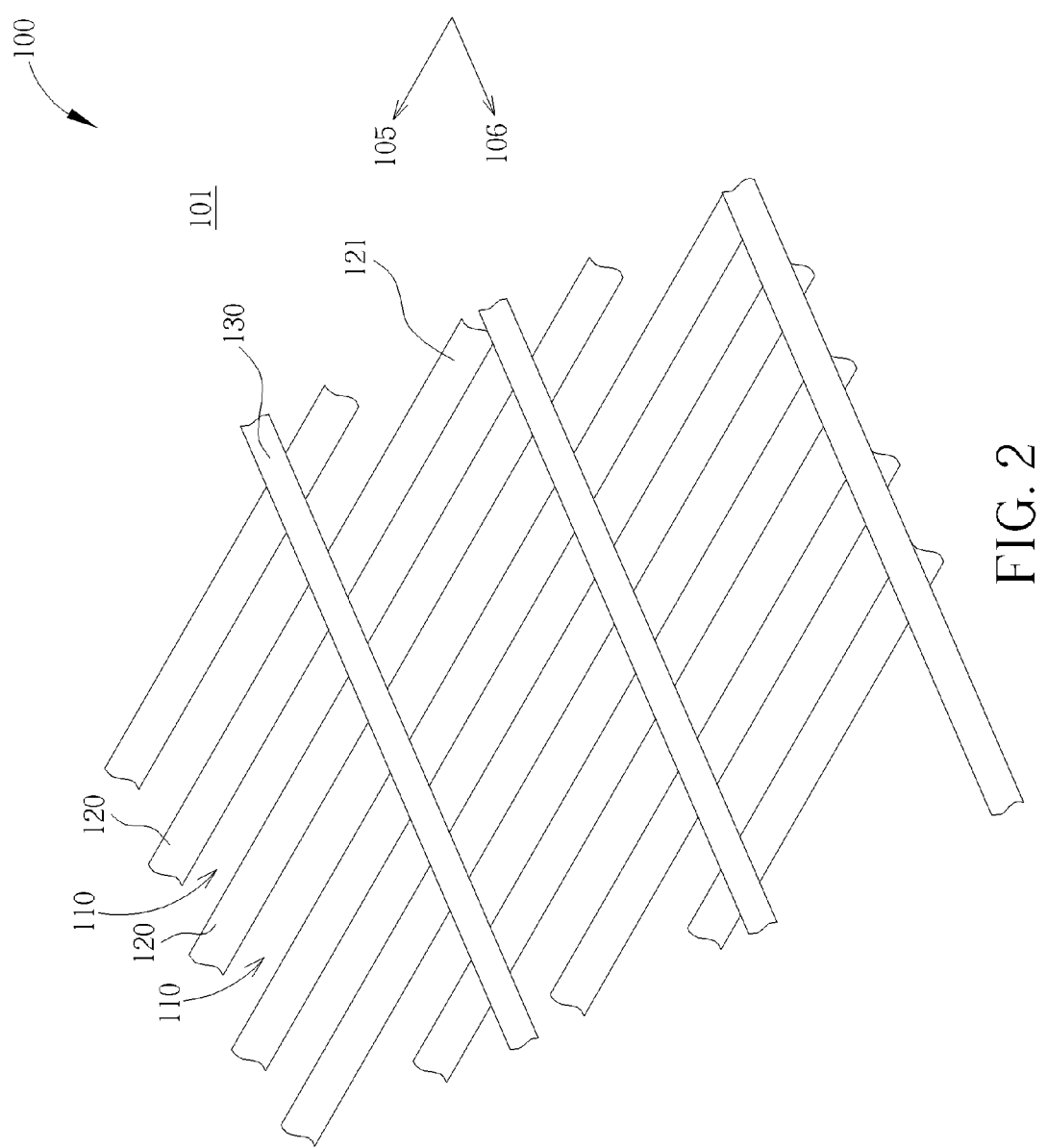

Secondly, refer to FIG. 2, a plurality of second shallow trench isolations 130 are added in FIG. 2. The second shallow trench isolations which are parallel with one another are also disposed on the substrate 101, separated by a proper distance, cut through the active blocks 120 and extend along the second direction 106. The first direction 105 and the second direction 106 are neither parallel with nor perpendicular to one another. The second shallow trench isolations 130 cut through the active blocks 120 so that the active blocks 120 become independent and island-like multiple active regions 121 which are electrically insulated to one another. Each active region 121 has a source, a drain and a gate disposed between the source and the drain. In order to simplify the illustrations, the source, the drain and the gate are not marked in FIG. 2. Please refer to the above described steps for the formation of the second shallow trench isolations 130.

One feature of the present invention resides in that: the first direction 105 of the first shallow trench isolations 110 is neither parallel with nor perpendicular to the second direction 106 of the second shallow trench isolations 130, and the first direction 105 has a certain angle to the second direction 106, so that the active regions 121 are neither parallel with nor perpendicular to the second shallow trench isolation 130s. For example, the first direction 105 and the second direction 106 have an angle from 1 degree to 53 degrees, preferably, by selecting the first direction 105 and the second direction 106 to an appropriate angle, so that a plurality of active regions 121 have areas large enough.

On one hand, when the angle between the first direction 105 and the second direction 106 is smaller, it can increase the area of the active regions 121. On the other hand, when the angle between the first direction 105 and the second direction 106 is larger, the area of the active regions 121 is smaller. Therefore, it is advisable to select an appropriate angle to obtain the active region 121 large enough.

Figure 3:
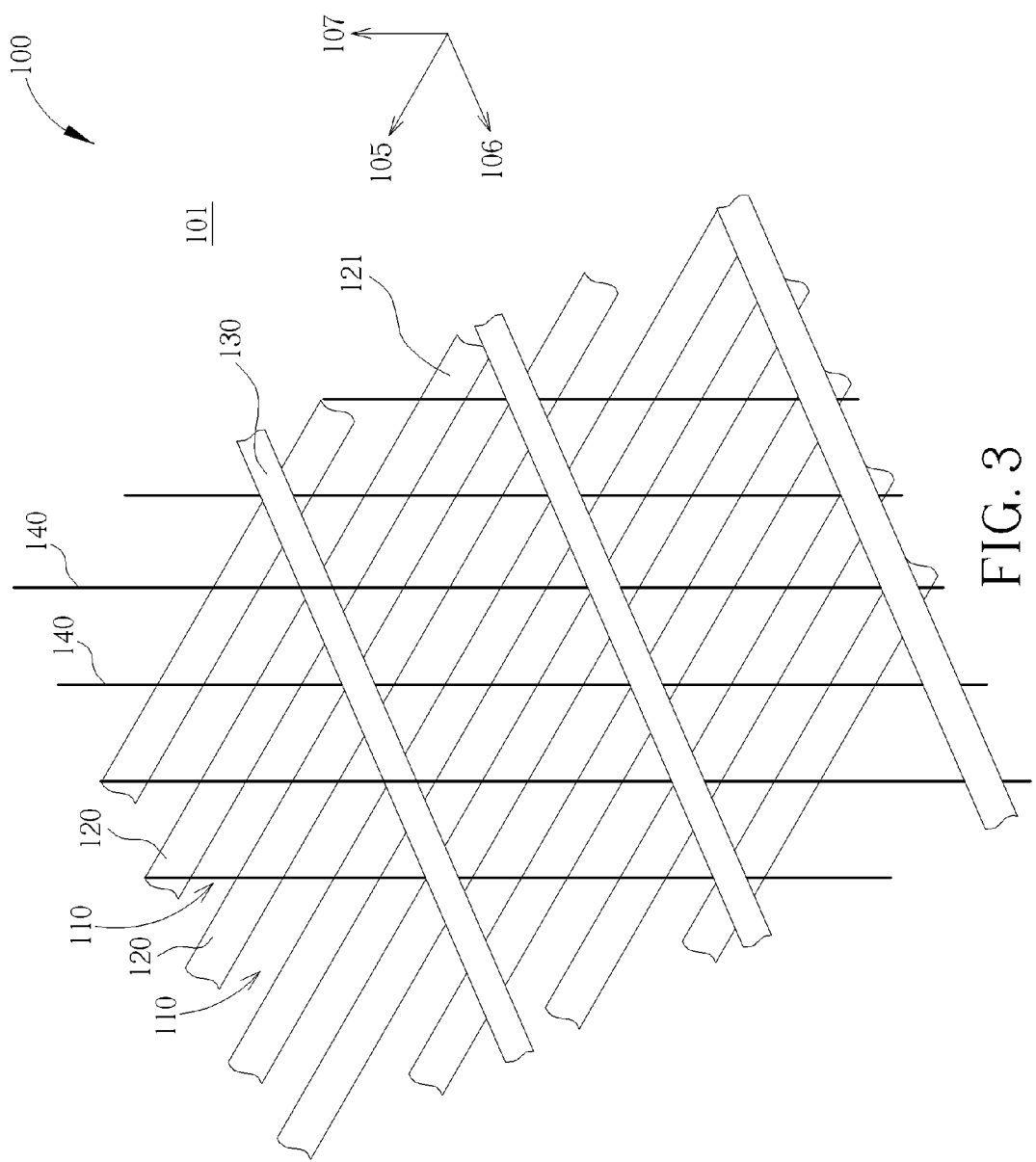

Please refer to FIG. 3, in one embodiment of the present invention, the semiconductor layout structure 100 further includes a plurality of word lines 140 disposed on the substrate 101, parallel with one another and extend along a third direction 107. The angle between the first direction 105 and the third direction 107 may be roughly equally divided by the second direction 106. For example, the angle of the first direction 105 and the third direction 107 may be from 30 degrees to 60 degrees.

Figure 4:
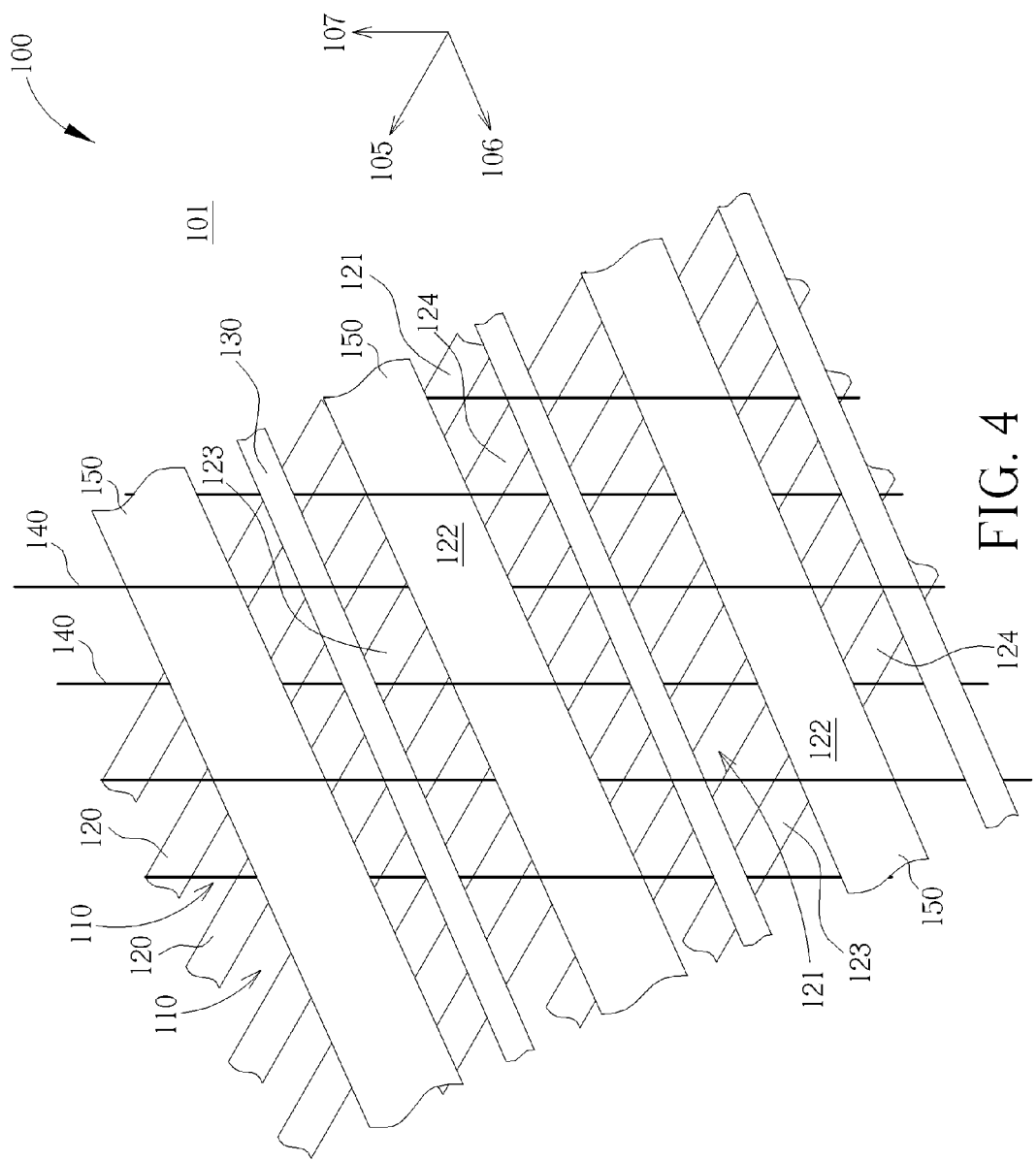

Please refer to FIG. 4, in another embodiment of the present invention, the semiconductor layout structure 100 further includes bit line contacts 150 disposed on the substrate 101, parallel with one another, respectively disposed between the second shallow trench isolations 130, and extend along the second direction 106. The bit line contacts 150 disposed between the second shallow trench isolations 130 respectively divide the active regions 121 corresponding to the active blocks 120 into a gate region 122 overlapping the bit line contacts 150 as well as the source region 123 and drain region 124 disposed on both sides of the gate region 122. Due to the specific angle of the first direction 105 and the second direction 106, the gate region 122, the source region 123 and the drain region 124 would obtain a gained area compared with the angle when the first direction 105 is perpendicular to the second direction 106.

Figure 5:
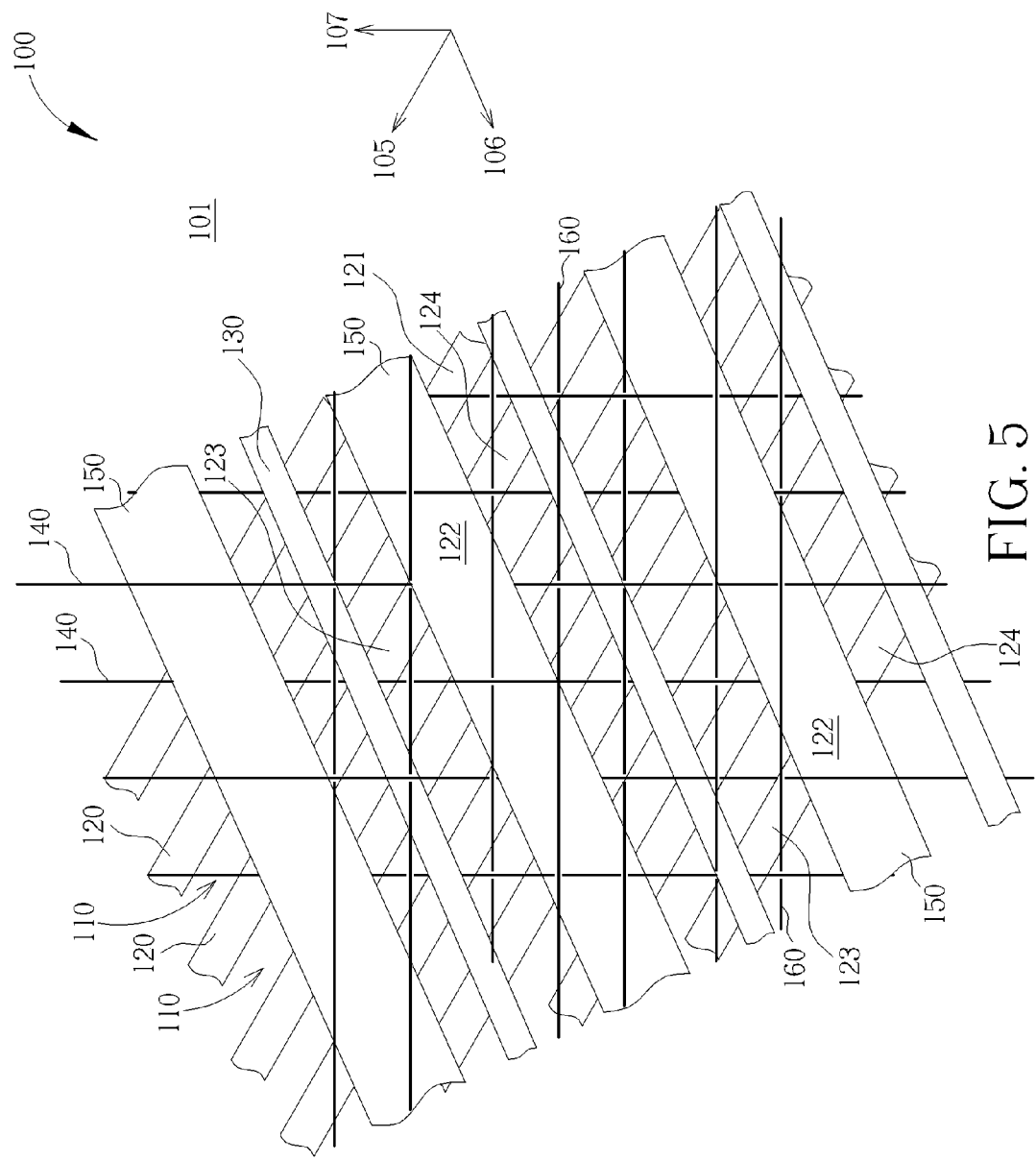
Figure 6:
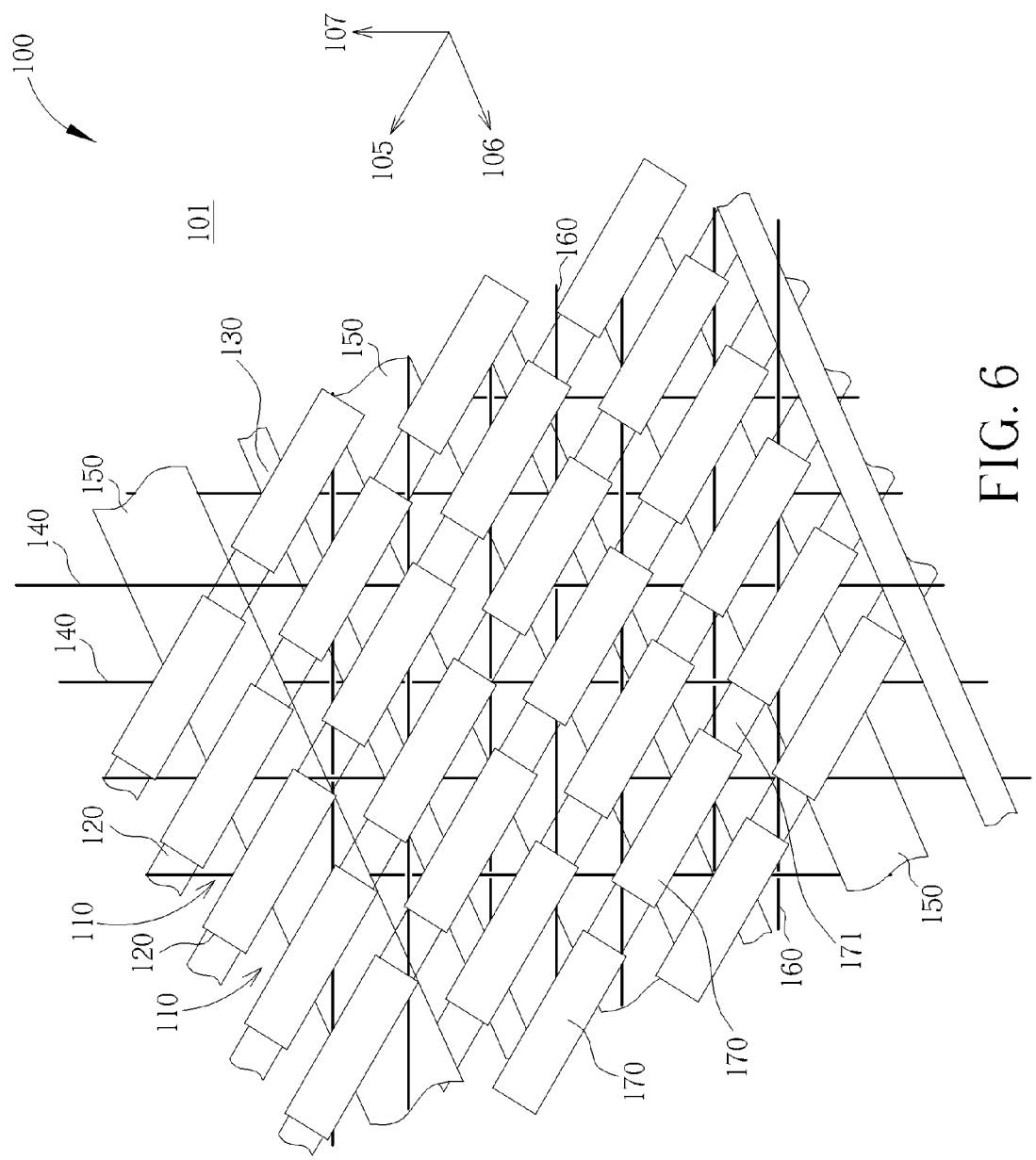

Please refer to FIG. 5, in another embodiment of the present invention, the semiconductor layout structure 100, further includes bit lines 160 disposed on the substrate 101, and simultaneously parallel with one another. The word lines 140 and the bit lines 160 are substantially perpendicular to each other. For example, in one embodiment of the present invention, the angle of the word lines 140 to the bit lines 160 may be between 85 degrees to 95 degrees.

In view of the above, the present invention also provides another semiconductor layout structure 100. Please refer to FIG. 6, the semiconductor layout structure 100 of the present invention, in addition to the above elements, further includes optional capacitor regions 170 and optional gaps 171. A plurality of capacitor regions 170 and a plurality of gaps 171 are disposed in the active region 121 of the active blocks 120 in an alternate order. The capacitor regions 170 may overlap the second shallow trench isolation 130 and the word lines 140. In addition, the bit line contacts 150 may overlap the adjacent gaps 171. Only for the reason of simplifying the illustrations, the active blocks 120, the active regions 121, the gate region 122, the source region 123 and drain region 124 are not marked in FIG. 6. Please refer to other figures for the reference of the active blocks 120, the active regions 121, the gate region 122, the source region 123 and the drain region 124.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor layout structure, comprising:
   a substrate;
   a plurality of active blocks, disposed on said substrate, parallel with each other and extending along a first direction;
   a plurality of first shallow trench isolations, disposed on said substrate, parallel with each other and respectively disposed between said plurality of active blocks; and
   a plurality of second shallow trench isolations, disposed on said substrate, cutting through said plurality of active blocks and extending along a second direction, wherein said first direction and said second direction have an angle between 1 degree to 53 degrees.

2. The semiconductor layout structure of claim 1, further comprising:
   a plurality of word lines, disposed on said substrate, parallel with each other and extending along a third direction, wherein said first direction and said third direction have an angle between 30 degrees to 60 degrees.

3. The semiconductor layout structure of claim 1, further comprising:

a plurality of bit line contacts, disposed on said substrate, parallel with each other, respectively disposed between said plurality of second shallow trench isolations and extending along said second direction, wherein said plurality of bit line contacts respectively divide said plurality of active blocks into a gate area overlapping said plurality of bit line contacts, as well as a source region and a drain region disposed at both sides of said gate region.

4. The semiconductor layout structure of claim 2, further comprising:
a plurality of bit lines, disposed on said substrate and simultaneously parallel with each other, wherein said plurality of word lines and said plurality of bit lines are substantially perpendicular to each other.

5. The semiconductor layout structure of claim 4, wherein said plurality of word lines and said plurality of bit lines have an angle from 85 degrees to 95 degrees.

6. A semiconductor layout structure, comprising:
a substrate;
a plurality of active blocks, disposed on said substrate, parallel with each other and extending along a first direction;
a plurality of first shallow trench isolations, disposed on said substrate, parallel with each other and respectively disposed between said plurality of active blocks;
a plurality of second shallow trench isolations, disposed on said substrate, cutting through said plurality of active blocks so that said plurality of active blocks become a plurality of active areas which are electrically insulated to each other, and extending along a second direction, wherein said first direction and said second direction have an angle between 1 degree to 53 degrees;
a plurality of word lines, disposed on said substrate, parallel with each other and extending along a third direction, wherein said first direction and said third direction have an angle between 30 degrees to 60 degrees;
a plurality of bit line contacts, disposed on said substrate, parallel with each other, respectively disposed between said plurality of second shallow trench isolations and extending along said second direction, wherein said plurality of bit line contacts respectively divide said plurality of active areas into a gate area overlapping said plurality of bit line contacts, as well as a source region and a drain region disposed at both sides of said gate region;
a plurality of bit lines, disposed on said substrate and simultaneously parallel with each other, wherein said plurality of word lines and said plurality of bit lines are substantially perpendicular to each other; and
a plurality of capacitor regions and a plurality of gaps alternately disposed in said plurality of active blocks, wherein said plurality of capacitor regions overlap said plurality of second shallow trench isolations and said plurality of word lines, and said plurality of bit line contacts overlap said plurality of gaps.

7. The semiconductor layout structure of claim 6, wherein said plurality of word lines and said plurality of bit lines have an angle from 85 degrees to 95 degrees.

* * * * *